Figure 1:
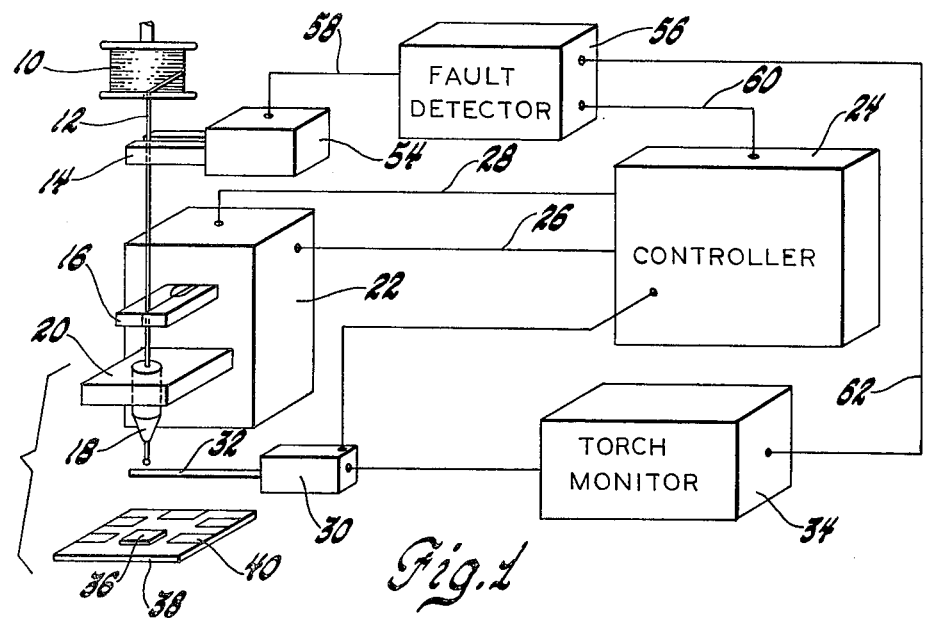

United States Patent [19]

Persson et al.

[11] 4,213,556
[45] Jul. 22, 1980

[54] METHOD AND APPARATUS TO DETECT AUTOMATIC WIRE BONDER FAILURE

[75] Inventors: Frederick M. Persson; David C. Frankel, both of Kokomo, Ind.

[73] Assignee: General Motors Corporation, Detroit, Mich.

[21] Appl. No.: 947,493

[22] Filed: Oct. 2, 1978

[51] Int. Cl.² .............................................. H01L 21/90
[52] U.S. Cl. ....................................... 228/104; 228/4.5
[58] Field of Search ................... 228/4.5, 9, 56.5, 103, 228/104

[56] References Cited

U.S. PATENT DOCUMENTS

| | | | |
|---|---|---|---|
| 3,168,881 | 2/1965 | Morin | 112/273 |
| 3,430,835 | 3/1969 | Grable et al. | 228/4.5 |
| 3,442,237 | 5/1969 | Causby et al. | 112/278 |
| 3,734,386 | 5/1973 | Hazel | 228/4.5 |
| 3,891,812 | 6/1975 | Marforio | 112/273 |
| 3,941,486 | 3/1976 | Tyler | 228/4.5 X |

Primary Examiner—Carl E. Hall
Assistant Examiner—K. J. Ramsey
Attorney, Agent, or Firm—Warren D. Hill

[57] ABSTRACT

A wire bonder for making electrical connections from semiconductor chips to conductors on a lead frame includes a fault sensing system to detect a failure of the ball bond at the chip pad as well as the lead bond. Pad bond failure is detected by providing a wire feed sensor and a logic element for determining whether the wire is being fed when the bonding tip is moved from the chip to the lead. There is no wire feed if the pad bond fails. Lead bond failure is detected by clamping the wire after the lead bond is made and pulling on the wire to either break off the tail at the bond or pull the bond loose from the lead. Then the clamp is released momentarily so that if the tail has not broken free, an extra length of wire will be pulled from the tip. The extra length of wire is sensed by an electronic flame off torch monitor.

2 Claims, 11 Drawing Figures

METHOD AND APPARATUS TO DETECT AUTOMATIC WIRE BONDER FAILURE

This invention relates to a wire bonder failure detection method and apparatus and particularly to such method and apparatus for detecting the failure of bonds.

It is common practice to electrically interconnect a semiconductor chip with a lead frame by bonding gold wires first to a pad on the chip and then to a lead terminal. Automatic wire bonders are known which include a capillary bonding tip through which a fine gold wire is fed from a spool. A flame off torch forms a ball on the end of the wire. The tip is manipulated to press the ball against a pad and then suitable energy is applied to effect a bond. For thermal compression bonding, the capillary tip is held in a heated holder whereas for ultrasonic bonding an ultrasonic transducer is attached to the capillary bonding tip. After the pad bond is formed, the tip if moved to a terminal of the lead frame so that a loop of wire is pulled from the tip during that motion and a bond is then made between the wire and the lead frame. Thereafter, the tip is raised slightly to pull a short length of wire from its end and then the wire is clamped as the tip continues to move from the lead bond to break the tail from the bond. Then the tip is moved adjacent a flame off torch which forms a new ball on the end of the wire and the process is repeated for another chip to lead frame interconnection. In addition, a chip alignment feature allows the bonding apparatus to operate very rapidly and accurately with minimal operator supervision. To assure the continuous and efficient operation of an automatic bonder, it is desirable for the bonders to be able to recognize all defective wire bonding situations. Electronic ball forming systems are frequently used on wire bonders. The output of the electronic torch can be monitored to sense certain bonding defects. In particular, the torch monitor can detect the absence of a wire extending from the bonding tip or the presence of a wire which is too long. In most cases, however, the torch monitor will not sense the two primary failure modes, missed chip bonds and missed package lead bonds. It is, therefore, desirable to make automatic and semiautomatic wire bonders cost effective by providing a complete bonding failure detection method and apparatus.

It is a general object of this invention to provide a method and apparatus for use with a wire bonder for semiconductor devices to detect the failure of a ball bond made on the semiconductor device.

It is a further object of the invention to provide in such a system a method and apparatus for detecting the failure of a lead bond.

The invention is carried out by forming a ball bond to a chip pad and then monitoring wire feed when the tip is moving to the lead wherein no wire feed occurs if the bond breaks loose from the pad and is indicative of a failure. The invention further comprises making a lead bond, then clamping the wire and pulling it to attempt to break the wire from the bond and then momentarily opening the clamp to pull an additional length of wire from the tip if the bond has failed and the wire has not separated from the loop and then sensing the additional length of wire extending from the tip to detect the failure of the lead bond.

The invention is further carried out by providing in a wire bonding apparatus a wire feed sensor coupled with a fault detector which is actuated by a controller of the bonding apparatus during a loop forming mode after formation of a pad bond so that any failure of wire feed during the loop forming mode is sensed and is indicative of a failure of the pad bond. The invention further includes a control apparatus for momentarily releasing the wire clamp after a lead bond is formed to allow an extra length of wire to be pulled from the bonding tip if the bond has failed and an apparatus for sensing the additional wire thereby indicating the failure of the lead bond.

Figure 2:
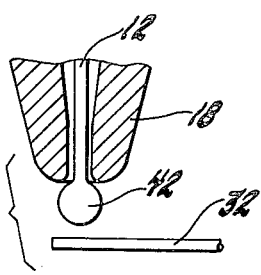
Figure 3:
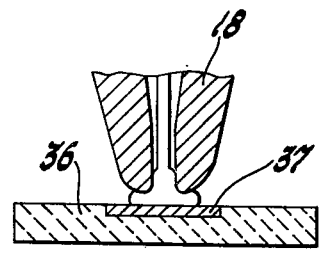
Figure 4:
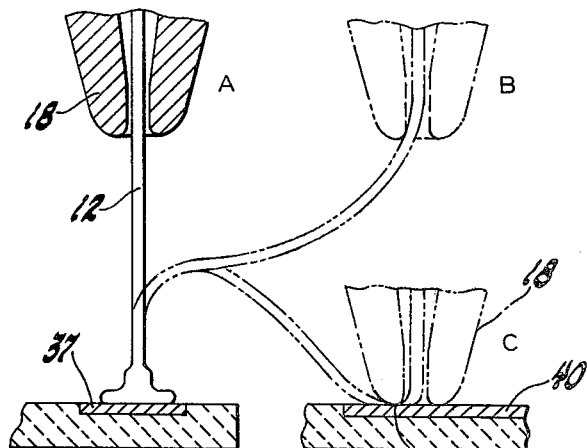
Figure 5:
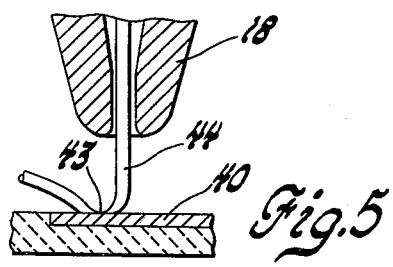
Figure 6:
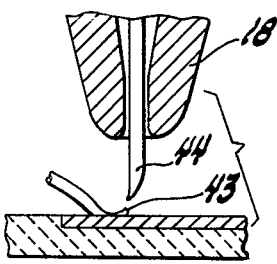
Figure 7:
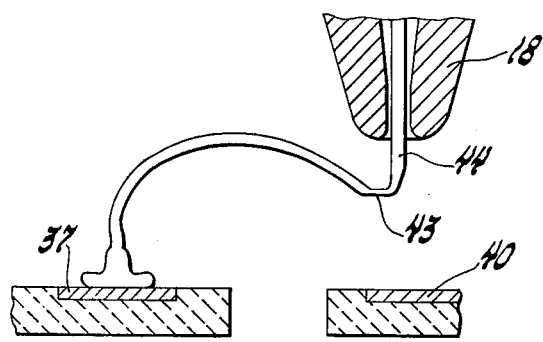
Figure 8:
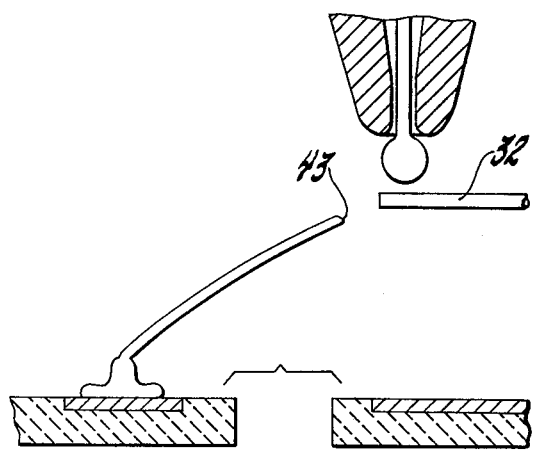
Figure 9:
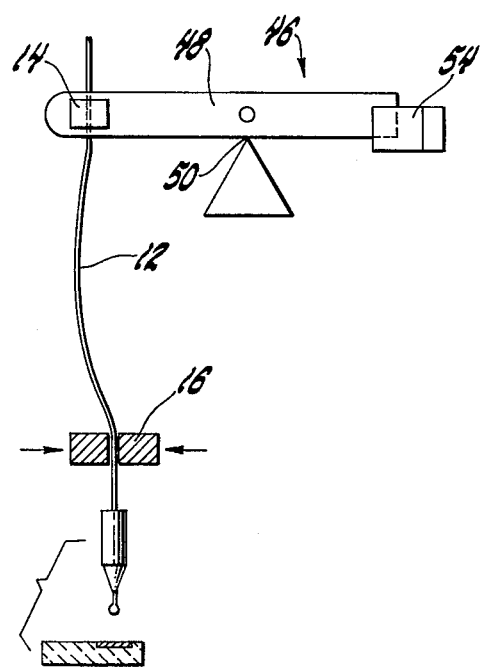
Figure 10:
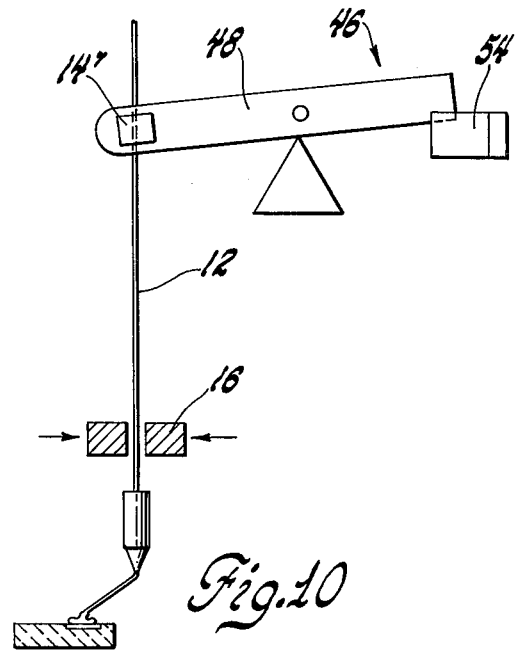
Figure 11:
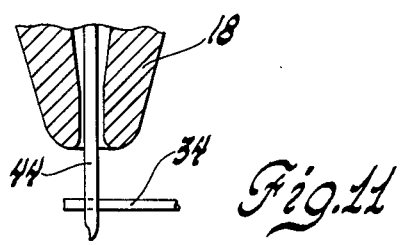

The above and other advantages will be made more apparent from the following specification taken in conjunction with the accompanying drawings wherein like reference numerals refer to like parts and wherein:

FIG. 1 is a schematic representation of an automatic wire bonder with failure detection according to the invention, FIG. 2 is a cross-sectional view of a bonding tip and an electronic flame off electrode illustrating the formation of a ball, FIG. 3 is a partial cross-sectional view of a bonding tip and a semiconductor chip illustrating the formation of a pad bond, FIG. 4 is a partial cross-sectional view of a chip and a lead with a bonding tip in three positions, A, B and C, illustrating a sequence of tip movements, FIGS. 5 and 6 are partial cross-sectional views of the bonding tip and a lead illustrating two operations following the formation of a lead bond, FIG. 7 is a partial cross-sectional view of a bond tip, a chip and a lead illustrating the wire condition upon a lead bond failure, FIG. 8 is a partial cross-sectional view of a chip, a tip and a lead and a flame off electrode illustrating the formation of a ball subsequent to a lead bond failure, FIGS. 9 and 10 are schematic views of a wire feed sensor coupled with a portion of the bonding system during no wire feed and wire feed mode respectively, and FIG. 11 is a partial cross-sectional view of a bonding tip and electronic flame off electrode illustrating the detection of excess wire according to the invention.

Referring to FIG. 1, there is shown a schematic representation of the basic components of a bonding system. A spool 10 stores a coil of gold wire 12 which is fed to a wire drag device 14, to a wire clamp 16, and finally to a bonding capillary tip 18. The wire drag device 14 retards the movement of wire from the coil to assure that it is fed only when positively pulled from the coil by the bonding tip 18. The bonding tip 18 is held in a support 20 which is a heated holder for thermocompression bonding or which is a transducer for ultrasonic bonding. The clamp 16 and the support 20 are mounted on an actuator 22 for movement together relative to the workpiece. A controller 24 provides signals on line 26 for controlling the actuator to a programmed position. The clamp 16 is also controlled by the controller 24 via a line 28 which operates a clamping solenoid, not shown. An electronic flame off torch 30 supports an electrode 32 which is positioned in a convenient location adjacent the path of the bonding tip 18. The workpiece is represented as a semiconductor chip 36 mounted on a flat package 38 having leads 40. The apparatus as thus far described is commonly used in the manufacture of semiconductor devices and is well known. The automatic wire bonder is, for example, an Autobonder Model 1432 made by GCA Corp., Sunnyvale, Calif. The electronic flame off torch 30 and monitor 34 is, for example, an Electroball Model 2200, made by Technicraft Products, Sunnyvale, Calif.

In operation the electronic flame off electrode 32 is moved under the bonding tip 18 and an electrical discharge between the electrode and the wire 12 causes a ball 42 to form adjacent the end of the tip 18, as shown in FIG. 2. After the bonding tip has been aligned with the chip bonding pads the bonding capillary tip 18 descends to the chip pad 37 bonding energy is applied, the ball is deformed, as shown in FIG. 3, and a metallurgical bond takes place. This type of bond is called a ball bond or pad bond. Upon completion of the pad bond, the bonding tip 18 is raised and the wire is allowed to feed through the tip as shown at position A of FIG. 4. After the tip has reached a preset level called loop height, the chip assembly or bonding head is moved to align the tip with the package lead bond site as shown at position B and the tip is then moved down against the package lead 40 as shown at position C and bonding energy is applied to form a stitch bond or wedge bond in a manner similar to that described for the ball bond. The bonding capillary is designed to form a wedge shaped bond and the wire is deformed into a weakened thin section 43 where the tip 18 bears against the lead 40. At the completion of the package lead wedge bond, the bonding tip is lifted a short distance before the wire clamp is closed to allow a short length of wire or tail 44 to be pulled through the tip as shown in FIG. 5. The wire clamp is closed at a preset time and the tip 18 and clamp assembly continue to rise in unison breaking the wire at the weakened section 43 between the bond and the tail 44 as shown in FIG. 6. The tip continues to rise to its home position with the tail 44 held in position by the closed wire clamp. At or near the home position the electronic torch electrode 32 is passed under the wire and an arc jumps the gap between the electrode and the wire end to form a ball.

The most common types of failures are exhausted wire supply, no bond to chip pad, no bond to package lead, and no ball formed for subsequent chip pad bond. No single detection device can sense all of the failure modes. By monitoring the electronic torch current flow, existing electronic torch monitors sense two conditions: an open circuit condition which occurs when wire does not extend below the bonding tip and a short circuit condition which occurs when too much wire extends below the tip and the electrode strikes the wire. It cannot sense no bond to chip because the ball which did not bond to the chip will usually bond to the package lead when the tip descends to make what would normally be the stitch bond. The wire will separate just above the ball bond when the wire clamp is closed and the end of the wire will be balled as usual by the flame off electrode. The electronic torch output monitor 34 will not sense this failure. The no bond to package lead failure mode is not detected by the electronic torch monitor because the stitch bond lifts off the lead after the wire clamp closes as shown in FIG. 7. The wire subsequently breaks at the weak section 43 formed during the stitch bond as shown in FIG. 8. The length of the wire left below the tip is, therefore, the same as that for a good bond. The electronic torch monitor 34 cannot detect whether the bond is sound or had lifted from the lead.

To sense the failure of the ball bond should it occur, a wire feed sensor 46 is added to the drag 14 of FIG. 1. The function of the wire feed sensor is to monitor the wire movement as it passes from the wire spool 10 to the bonding tip 18. The operation of this sensor depends on the dynamics of the wire between the spool and the wire clamp 16. During a successful bonding cycle the wire is stationary at the bonding tip home position FIG. 4, position A, and moving during the wire looping mode represented by FIG. 4, position B. If a ball is not present at the end of the wire or if the bond to the chip fails no wire feed occurs. Tension is developed by the drag 14 as the wire is being pulled from the spool 10 by the manipulation of the tip 18.

The wire feed sensor 46 is shown schematically in FIGS. 9 and 10 comprises a counter-balanced arm 48 pivoted at a point 50 intermediate its length. One end of the arm 48 carries the drag 14 comprising a pair of friction pads 14' between which the wire 12 passes. The other end of the arm 48 is movable into the gap of an optoelectronic sensor 54. Such a sensor, as is well known, comprises a light source spaced from a light detector, such that when the light beam to the detector is interrupted by the arm 48, the detector output signal is indicative of the position of the arm 48. FIG. 9 illustrates the wire feed sensor in its rest position. That occurs when no wire feed takes place. There is no drag on the friction pads 14' in that case and the arm 48 is balanced in a horizontal position such that its right end blocks the gap of the optoelectronic sensor 54. FIG. 10 illustrates the case where the wire is being fed through the tip 18 due to the tip manipulation. The friction developed by the pads 14' is just sufficient to cause the arm 48 to be pulled away from its rest position. Consequently, the arm 48 moves from the optoelectronic gap.

Referring to FIG. 1 a fault detector 56 is provided to receive the signal from the optoelectronic sensor 54 on line 58 and to receive a further signal from the controller 24 on line 60. The signal on line 60 is generated by circuitry within the controller 24 during the wire loop forming period when normally the wire 12 should be fed. That signal is combined with the signal on line 58 by logic circuitry in the fault detector 56. That logic circuitry indicates by a failure signal that a pad bond failure has occurred if the respective signals indicate that the wire 12 is not being fed at a time when it should be fed thereby indicating that a pad bond failure has occurred. This failure signal can be used to instruct the machine controller 24 to enter a bond repair mode and the wire can be replaced at the end of the machine cycle. In addition, the failure signal can actuate a sensing alarm to alert an operator that a failure has occurred.

In order to detect the failure of a lead bond, the conventional controller 24 is altered to slightly change the program of the operation of clamp 16. Previously the wire clamp closed at a preset time after the bonding tip 18 moved from the lead bond surface to form a wire tail of desired length and pulled that tail from the bond, and remained closed until the bonding head descended to make the next chip pad ball bond. By adjusting the wire clamp operation to allow the clamp to open momentarily after the tail is pulled, a lifted lead bond will cause excess wire to be pulled from the tip 18 by the still attached loop as seen in FIG. 7. The clamp then recloses as the tip 18 continues to rise so that the wire breaks in the weak section 43 which was formed during the attempted lead bond. Then during the step of forming a ball on the end of the wire, the excess wire 44 below the tip will be struck by the flame off electrode 32 as illustrated by FIG. 11, and a short circuit condition will be sensed by the torch monitor 34. The torch monitor output is fed to the fault detector 56 on line 62 where logic circuitry is used to produce a failure signal. The failure signal is used to cause the controller 24 to stop the bond cycle and allow an operator to manually form a ball for the next bonding cycle. It also indicates that a bond repair is necessary to replace a missing wire.

A good package lead bond will not be disturbed when the wire clamp is opened momentarily because the wire has already separated from the bond. A wire retainer, not shown, mounted just above the wire clamp 16 is required to prevent the wire from falling through the wire clamp and tip when the clamp is momentarily opened. The retainer is a device to provide a very light drag on the wire.

It will thus be seen that the method and apparatus according to this invention provide a way of monitoring all the most common types of failures which occur during an automatic or semiautomatic wire bond sequence. That is, the two essential operations, i.e. the two bonds, are monitored by (1) sensing wire feed during the loop forming mode to verify the soundness of the ball bond and (2) momentarily releasing the clamp shortly after the lead bond operation and detecting the wire condition by the electronic flame off torch monitor to verify the soundness of the lead bond.

I claim:

1. A method of bonding a wire to interconnect first and second conductors and detecting a bond failure comprising the steps of
   supplying wire from a source through a hollow bonding tip,
   applying the bonding tip to the first conductor to bond the wire thereto at a first bond site,
   moving the bonding tip to a second bond site at the second conductor to form a wire bridge from the first conductor to the second conductor,
   sensing the feeding of wire from the source to the bonding tip by a wire feed sensor,
   monitoring the wire feed sensor while the bonding tip is moving from the first conductor to the second conductor whereby an absence of wire feeding during said bonding tip movement is indicative of a bond failure at the first conductor,
   applying the bonding tip to the second bond site to bond the wire thereto,
   moving the bonding tip away from the second bond site to a preset location, clamping the wire at a preset time during the movement so that a short pigtail will be pulled from the tip and the wire will break from the second bond site at the preset time if a sound bond is made there and will break at a second later time if the bond pulls loose from the second bond site,
   momentarily releasing the clamp at a time between the preset time and the second time to pull an additional pigtail length from the tip if due to bond failure the wire did not break at the second bond site,
   passing an electronic flame off electrode under the bonding tip when reposed at its preset location to form a ball on the end of the pigtail whereby the electrode will touch the pigtail if the said additional length extends from the tip, and
   monitoring the electronic flame off electrode to sense whether it touches the pigtail thereby providing a signal if the bond pulled loose from the second bond site.

2. A wire bonder for interconnecting first and second spaced conductors including apparatus for detecting failure of the wire bond to either of the conductors comprising
   wire supply means
   a bonding tip for holding the wire in position and bonding the wire to each conductor,
   a holder for supporting the bonding tip and moving it from one conductor to another to form a loop bridging the conductors,
   wire feed sensor means for detecting wire feed from the supply means
   a controller to effect bonding at the first conductor and then, during a loop forming mode, moving the tip to the second conductor to effect bonding thereto whereby wire is drawn from the wire supply means,
   the controller further including means responsive to the wire feed sensor and actuated in the loop forming mode to provide a failure signal when no wire feed occurs thereby signaling a failure of the bond at the first conductor,
   clamp means controlled by the controller for breaking the wire at the bond on the second conductor and controlled to release the wire after the time of breaking the wire for paying out an additional length of wire from the tip when the wire fails to break due to bond failure, and
   means for detecting the presence of said additional length of wire thereby detecting the failure of the bond at the second conductor.

* * * * *